(12) United States Patent
Lee et al.

(10) Patent No.: US 11,694,589 B2
(45) Date of Patent: Jul. 4, 2023

(54) SCAN DRIVER CIRCUITRY AND OPERATING METHOD THEREOF

(71) Applicant: UNIVERSITY-INDUSTRY COOPERATION GROUP OF KYUNG HEE UNIVERSITY, Yongin-si (KR)

(72) Inventors: Seung Woo Lee, Seoul (KR); Jae Hee Jo, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 17/534,998

(22) Filed: Nov. 24, 2021

(65) Prior Publication Data
US 2022/0165195 A1 May 26, 2022

(30) Foreign Application Priority Data
Nov. 25, 2020 (KR) .................. 10-2020-0160317

(51) Int. Cl.
*G11C 19/00* (2006.01)
*G09G 3/20* (2006.01)
(Continued)

(52) U.S. Cl.
CPC .............. *G09G 3/20* (2013.01); *G11C 19/28* (2013.01); *H03K 17/6871* (2013.01);
(Continued)

(58) Field of Classification Search
CPC ........... G11C 19/28; G09G 2310/0286; G09G 3/3674; G09G 3/3677; G09G 2320/0233; G09G 2310/08; G09G 2310/0267
See application file for complete search history.

(56) References Cited

U.S. PATENT DOCUMENTS 10,096,286 B2 * 10/2018 Cho .................. G09G 3/3266
2016/0217728 A1 * 7/2016 In ..................... G09G 3/2096
(Continued)

FOREIGN PATENT DOCUMENTS

| KR | 10-1183431 B1 | 9/2012 |
|---|---|---|
| KR | 10-1543281 B1 | 8/2015 |

(Continued)

OTHER PUBLICATIONS

Communication dated May 30, 2022, issued by the Korean Patent Office in counterpart Korean Patent Application No. 10-2020-0160317.
(Continued)

*Primary Examiner* — Tuan T Lam
(74) *Attorney, Agent, or Firm* — Sughrue Mion, PLLC

(57) ABSTRACT

A scan driver circuit for an active matrix array includes a plurality of stages and a plurality of decoders that are sequentially driven at different driving timings in a same stage based on a combination of the plural decoder signals or that are driven at the same timing in different stages where a last decoder of the plural decoders sequentially outputs a scan line signal according to a driving state of the plural decoders in each of plural stages, each of the plural decoders includes an input part, an output part and a reset part, and the input part includes a first decoding transistor, a fourth decoding transistor connected to a clock signal and second, third, fifth and sixth decoding transistors connected in series to each of the first decoding transistor and the fourth decoding transistor and connected to the plural decoder signals.

15 Claims, 17 Drawing Sheets

(51) Int. Cl.
*H03K 17/687* (2006.01)
*G11C 19/28* (2006.01)

(52) U.S. Cl.
CPC . *G09G 2310/0267* (2013.01); *G09G 2310/08* (2013.01); *G09G 2320/0233* (2013.01); *G09G 2340/0435* (2013.01)

(56) References Cited

U.S. PATENT DOCUMENTS

| 2018/0096733 A1* | 4/2018 | Kim | G09G 3/20 |
| 2021/0193007 A1* | 6/2021 | Cheng | G09G 3/3266 |

FOREIGN PATENT DOCUMENTS

| KR | 10-1630324 B1 | 6/2016 |
| KR | 10-2016-0148797 A | 12/2016 |
| KR | 10-1758770 B1 | 7/2017 |
| KR | 10-1996893 B1 | 7/2019 |

OTHER PUBLICATIONS

Office Action dated Nov. 29, 2022 issued by the Korean Patent Office in Korean Application No. 10-2020-0160317.

* cited by examiner

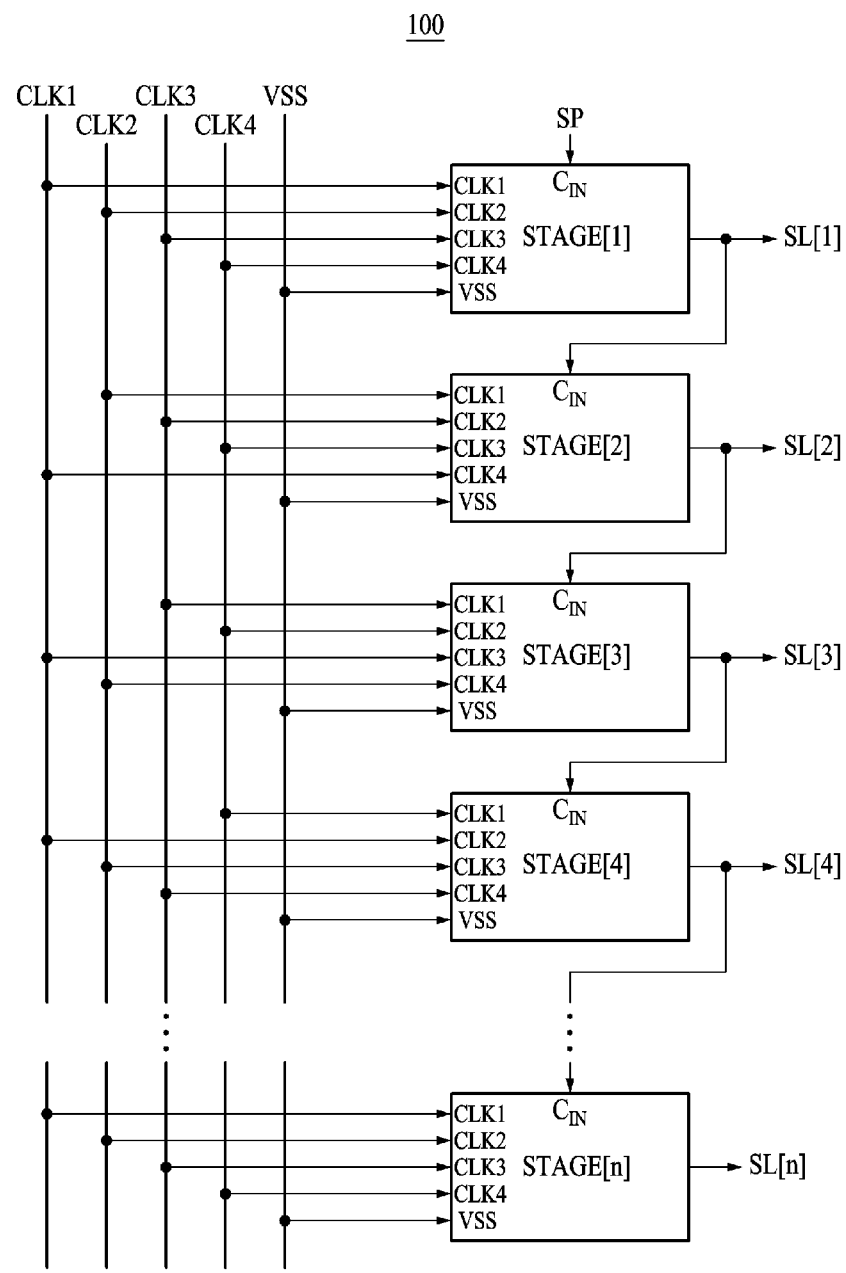

710

730

SCAN DRIVER CIRCUITRY AND OPERATING METHOD THEREOF

CROSS-REFERENCE TO RELATED APPLICATION

This application claims the priority benefit of Korean Patent Application No. 10-2020-0160317, filed on Nov. 25, 2020 in the Korean Intellectual Property Office, the disclosure of which is incorporated herein by reference.

TECHNICAL FIELD

The present disclosure relates to a technical idea of being suitable for a flexible circuit by driving individually scan lines and being capable of realizing high resolution by using a small number of signal lines, and more particularly to a technology of being capable of realizing high resolution using a small number of signal lines while respectively and independently driving scan lines of an active matrix array using a plurality of decoders.

BACKGROUND ART

Since a circuit on a flexible substrate has a structure wherein continuous mechanical stress is applied, the probability of error occurrence is high.

In the case of a commercialized conventional shift register-type scan driver, an occurred error may also affect subsequent circuits, which can cause a serious problem.

Accordingly, a decoder-type scan driver circuit that individually drives each scan line is more suitable for a flexible active matrix array.

However, as the number of scan lines to be driven increases, the number of signal lines also increases, so there is a problem in that it is not suitable for high resolution.

FIG. 1A illustrates a circuit diagram of a generally used scan driver according to a conventional technology.

Referring to FIG. 1A, a scan driver 100 according to a conventional technology has a shift register structure wherein an output of a previous stage is used as an input of a next stage.

A scan driver consists of a plurality of stages, and to which row element of an active matrix array a data voltage is applied may be determined through scan line SL[n] connected to each of the stages.

Although this method has the advantage that only a certain number of signal lines need to be used regardless of the number of stages, there is a problem in that when an error occurs in a specific stage, the error is transmitted to the next stage.

Due to the characteristics of the flexible active matrix array, an error may occur in output voltage due to mechanical stress.

In this case, if the conventional shift register-type scan driver 100 is used, a fatal problem that all stages malfunction after an error occur may occur.

FIG. 1B illustrates a block diagram of a decoder-type scan driver according to a conventional technology.

Referring to FIG. 1B, in the case of a decoder-type scan driver 110, each state is independently driven, unlike the shift register type.

Accordingly, even if an error occurs in a specific stage, the operation of other stages is not affected.

However, as the number of rows to be driven increases, the number of signal lines should increase, so that an area occupied by a scan driver increases. Due to such a disadvantage, it is difficult to apply to a high-resolution active matrix array.

Meanwhile, the present disclosure relates to a technology developed by Kyunghee University Industry-University Cooperation Foundation (host research institute) through "research project name: Development of driving circuit for control of active complex array for biosignal detection/stimulation (detail project No.: 4011-2020-00023, research period: Mar. 1, 2020 to Nov. 30, 2020)" that is a part of a consigned research project (research project name) of Ministry of Science and ICT (department name) and Electronics and Telecommunications Research Institute (ETRI, research management institution).

RELATED ART DOCUMENTS

Patent Documents

Korean Patent No. 1758770, "MULTIPLEXER AND DISPLAY DEVICE"
Korean Patent No. 1543281, "GATE DRIVING CIRCUIT AND DISPLAY DEVICE HAVING THE GATE DRIVING CIRCUIT"
Korean Patent No. 1630324, "SHIFT REGISTER"
Korean Patent No. 1996893, "GATE DRIVER AND DRIVING METHOD THEREOF"

DISCLOSURE

Technical Problem

Therefore, the present disclosure has been made in view of the above problems, and it is one object of the present disclosure to provide a scan driver circuit that is suitable for a flexible circuit by individually driving scan lines and that is capable of realizing high resolution by using a small number of signal lines.

It is another object of the present disclosure to provide a scan driver circuit suitable for a flexible active matrix array, to which a lot of stress is applied, by individually controlling and driving all scan lines so that an error does not affect subsequent circuits.

It is another object of the present disclosure to drive only a specific block related to a specific screen to reduce unnecessary power consumption, and thus, to provide a scan driver circuit applicable to a device, which maintains a specific screen for a long time, such as a low-power wearable device.

It is another object of the present disclosure to individually drive all scan lines by using a plurality of decoders, and thus, provide a scan driver circuit capable of eliminating screen non-uniformity occurring upon implementation of ultra-high resolution and high refresh rates by a conventional shift register-type scan driver.

It is another object of the present disclosure to drive more scan lines with a small number of signal lines, and thus, to provide a scan driver circuit for realizing an ultra-high-resolution active matrix array.

It is yet another object of the present disclosure to provide a scan driver circuit suitable for the development of various form factors and the implementation of ultra-high resolution to further develop an active matrix array.

Technical Solution

In accordance with an aspect of the present disclosure, the above and other objects can be accomplished by the provision of a scan driver circuit for an active matrix array, wherein the scan driver circuit includes a plurality of stages, wherein a plurality of decoder signals are used in each of the plural stages, and the scan driver circuit includes a plurality of decoders that are sequentially driven at different driving timings in the same stage based on a combination of the plural decoder signals or that are driven at the same timing in different stages, wherein a last decoder of the plural decoders sequentially outputs a scan line signal according to a driving state of the plural decoders in each of the plural stages.

The combination of plural decoder signals may include at least one of a first combination wherein first and second decoder signals among the plural decoder signals indicate a low state, a second combination wherein the first decoder signal indicates a low state and the second decoder signal indicates a high state, a third combination wherein the first decoder signal indicates a high state and the second decoder signal indicates a low state, and a fourth combination wherein the first and second decoder signals indicate a high state.

A first decoder among the plural decoders included in the second stage among the plural stages may be driven at the same timing as a second decoder among the plural decoders included in a first stage among the plural stages, based on a combination of the plural decoder signals.

A first decoder of a first stage among the plural stages may be selectively driven when a decoder signal of the first combination is initially applied.

The second decoder of the first stage among the plural stages and the first decoder of the second stage among the plural stages may be selectively driven when the decoder signal of the first combination is applied secondarily.

The first stage among the plural stages may output a scan line signal when a decoder signal of the second combination is applied.

A second decoder of the second stage among the plural stages and a first decoder of a third stage among the plural stages may be selectively driven when the decoder signal of the second combination is applied.

Each of the plural decoders may include an input part, an output part and an reset part.

The input part may include a first decoding transistor and fourth decoding transistor connected to a clock signal; and second, third, fifth and sixth decoding transistors that are connected in series to each of the first decoding transistor and the fourth decoding transistor and that are connected to the plural decoder signals.

The input part may store a clock signal, as an input signal, in a first data node via first to sixth decoding transistors.

The output part may include first and sixth transistors connected to the first data node; and first and second capacitors connected between the first data node and the output terminal.

The output part may output the clock signal to the output terminal through the first and sixth transistors.

The reset part may include third and eighth transistors connected to the clock signal, fourth and ninth transistors connected to the first data node, and second, fifth, seventh and tenth transistors connected to a second data node configured to store a value opposite to a value of the first data node.

The reset part may reset the second data node according to an input state of the first data node and may connect the first data node and the output terminal to a low-level power line through the second data node.

In accordance with another aspect of the present disclosure, there is provided a method of driving a scan driver circuit for an active matrix array, wherein the scan driver circuit includes a plurality of stages, the method including: driving sequentially a plurality of decoders at different driving timings based on a combination of a plurality of decoder signals in each of the plural stages; driving a plurality of decoders at the same timing based on a combination of the plural decoder signals in different stages among the plural stages; and outputting sequentially scan line signals according to a driving state of the plural decoders in a last decoder among the plural decoders.

The combination of plural decoder signals may include at least one of a first combination wherein first and second decoder signals among the plural decoder signals indicate a low state, a second combination wherein the first decoder signal indicates a low state and the second decoder signal indicates a high state, a third combination wherein the first decoder signal indicates a high state and the second decoder signal indicates a low state, and a fourth combination wherein the first and second decoder signals indicate a high state.

The driving of the plural decoders at the same timing may include driving the first decoder among the plural decoders included in the second stage among the plural stages at the same timing as the second decoder among the plural decoders included in the first stage among the plural stages, based on a combination of the plural decoder signals.

Advantageous Effects

The present disclosure can provide a scan driver circuit that is suitable for a flexible circuit by individually driving scan lines and that is capable of realizing high resolution by using a small number of signal lines.

The present disclosure can provide a scan driver circuit suitable for a flexible active matrix array, to which a lot of stress is applied, by individually controlling and driving all scan lines so that an error does not affect subsequent circuits.

The present disclosure can drive only a specific block related to a specific screen to reduce unnecessary power consumption, and thus, can provide a scan driver circuit applicable to a device, which maintains a specific screen for a long time, such as a low-power wearable device.

The present disclosure can individually drive all scan lines by using a plurality of decoders, and thus, can provide a scan driver circuit capable of eliminating screen non-uniformity occurring upon implementation of ultra-high resolution and high refresh rates by a conventional shift register-type scan driver.

The present disclosure can drive more scan lines with a small number of signal lines, and thus, can provide a scan driver circuit for realizing an ultra-high-resolution active matrix array.

The present disclosure can provide a scan driver circuit suitable for the development of various form factors and the implementation of ultra-high resolution to further develop an active matrix array.

DESCRIPTION OF DRAWINGS

FIGS. 1A and 1B illustrate a scan driver according to a conventional technology.

BEST MODE

Figure 1B:
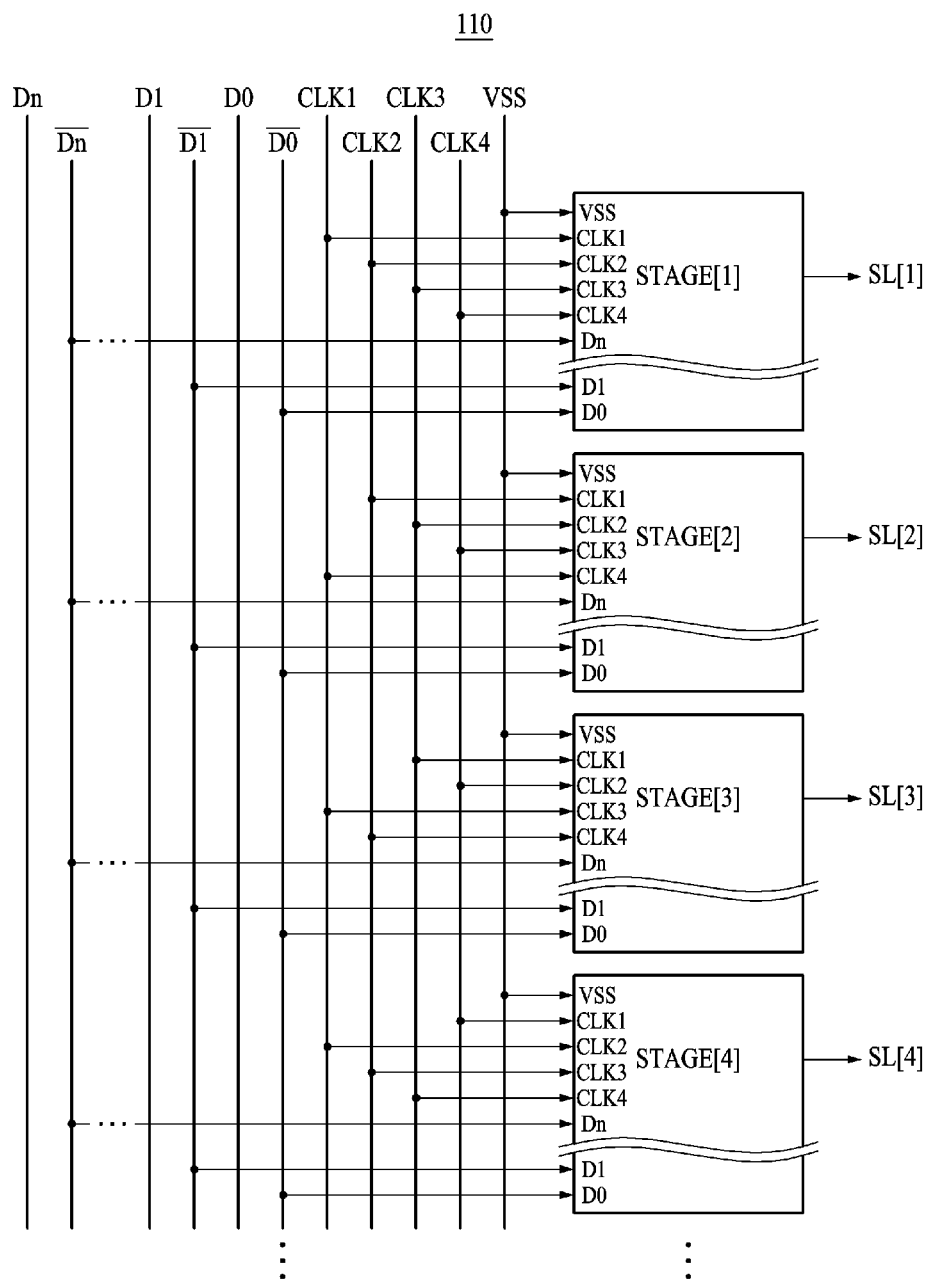

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the scope of rights according to the concept of the present disclosure.

It will be understood that when an element is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" in the specification should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure will now be described more fully with reference to the accompanying drawings, in which exemplary embodiments of the disclosure are shown. This disclosure may, however, be embodied in many different forms and should not be construed as limited to the exemplary embodiments set forth herein. Like reference numerals in the drawings denote like elements.

Figure 2:
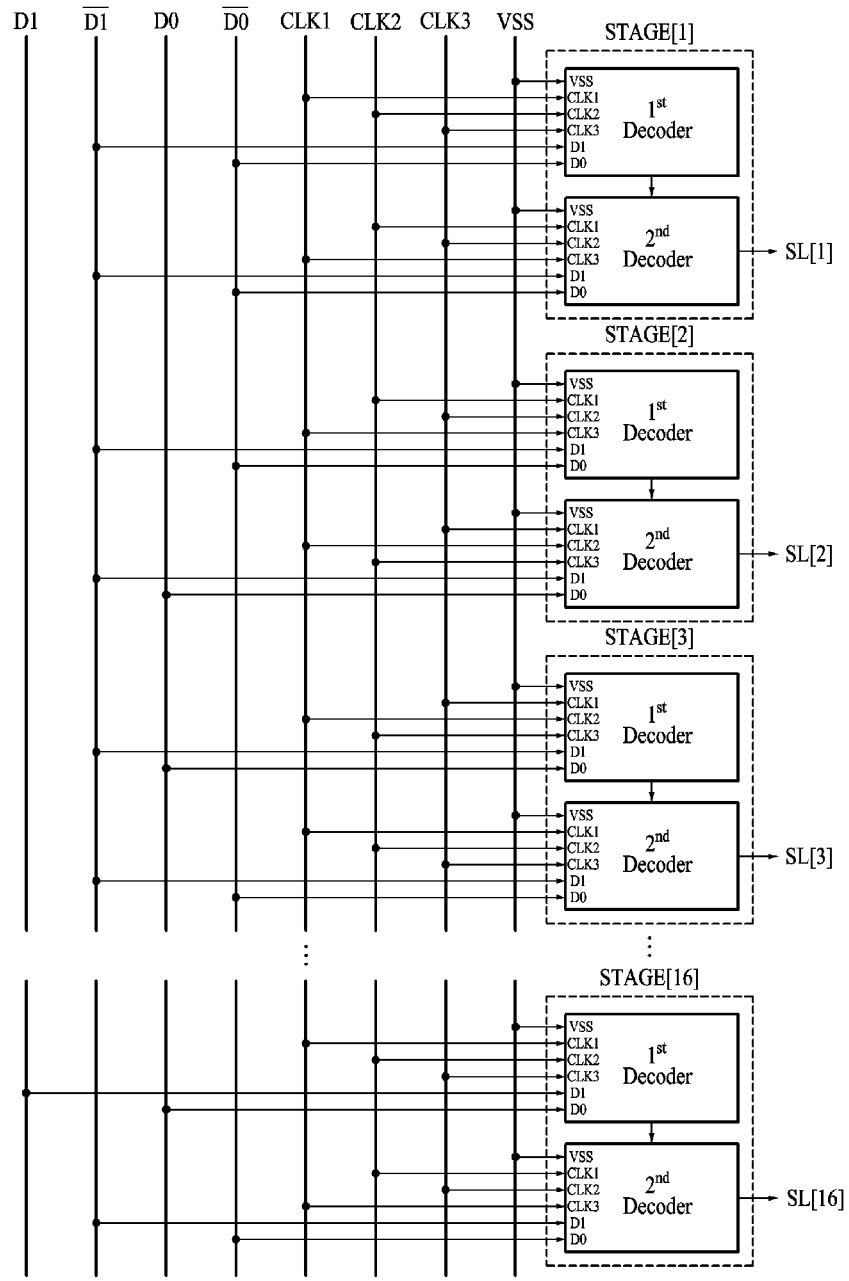
FIG. 2 illustrates a scan driver circuit according to an embodiment of the present disclosure.

FIG. 2 illustrates a scan driver circuit according to an embodiment of the present disclosure.

FIG. 2 illustrates a block diagram of the scan driver circuit according to an embodiment of the present disclosure.

Referring to FIG. 2, a scan driver circuit 200 according to an embodiment of the present disclosure may include a plurality of decoders signal lines D0, $\overline{D0}$, D1, and $\overline{D1}$, a plurality of clock signal lines CLK1 to CLK3, and a plurality of stages connected to low-level power line VSS.

Each of the plural stages includes a first decoder and a second decoder, and the first decoder and the second decoder may be connected to a decoder signal line, a clock signal line, and a low-level power line.

According to an embodiment of the present disclosure, the scan driver circuit 200 may use two decoders and a 2-bit decoder signal and may sequentially drive 16 scan lines. Here, the number of decoder signal lines may be increased according to a target number of scan lines and is not limited to two steps.

For example, the scan driver circuit 200 may drive the number of scan lines based on Equation 1 below.

$$2^{number\ of\ bits} \times number\ of\ stages \qquad \text{[Equation 1]}$$

In [Equation 1], "number of bits" may indicate the number of bits of an inputted signal, and "number of stages" may indicate the number of stages from which the scan driver circuit 200 outputs a scan line signal.

For example, when the scan driver circuit 200 uses three decoders and a 2-bit decoder signal, 64 scan lines may be sequentially driven.

Each of the plural stages outputs a scan line signal for each stage based on operations of the first and second decoders.

According to an embodiment of the present disclosure, the scan driver circuit 200 uses a plurality of decoder signals in each of the plural stages and includes a plurality of decoders that are sequentially driven at different driving timings in the same stage based on a combination of the plural decoder signals or that are driven at the same timing in different stages.

For example, the plural decoders may include the first and second decoders, and a decoder may be additionally disposed.

For example, a last decoder of the plural decoders may sequentially output a scan line signal according to a driving state of the plural decoders in each of the plural stages.

A plurality of stages for driving a plurality of scan lines are included, and each of the stages may include a plurality of decoders.

For example, the combination of plural decoder signals may include at least one of a first combination wherein first and second decoder signals among the plural decoder signals indicate a low state, a second combination wherein the first decoder signal indicates a low state and the second decoder signal indicates a high state, a third combination wherein the first decoder signal indicates a high state and the second decoder signal indicates a low state, and a fourth combination wherein the first and second decoder signals indicate a high state.

For example, the combination of the plural decoder signals may include more signal combinations as the number of the plural decoder signals increases.

According to an embodiment of the present disclosure, the inside of one stage of the scan driver circuit 200 includes a plurality of plural decoders, and the plural decoders are driven at different driving timings, respectively.

Accordingly, the scan driver circuit 200 may redundantly use a plurality of decoders signal lines in each decoder, so that more scan lines may be driven with a small number of decoder signal lines.

In addition, the scan driver circuit 200 may drive an n-th decoder in each stage at the same timing as an n+1-th decoder in a previous stage.

Accordingly, the scan driver circuit 200 may sequentially scan line signals output without blank timing.

According to an embodiment of the present disclosure, when the first decoder operates in a second stage in the scan driver circuit 200, the second decoder may be driven at the same timing in a first stage.

According to an embodiment of the present disclosure, the first decoder among the plural decoders included in the second stage among the plural stages may be driven at the same timing as the second decoder among the plural decoders included in the first stage among the plural stages, based on a combination of the plural decoder signals.

For example, the first decoder of the first stage among the plural stages may be selectively driven when the decoder signal of the first combination is initially applied.

According to an embodiment of the present disclosure, the second decoder of the first stage among the plural stages and the first decoder of the second stage among the plural stages may be selectively driven when the decoder signal of the first combination is applied secondarily.

For example, the second decoder of the second stage among the plural stages and a first decoder of a third stage among the plural stages may be selectively driven when the decoder signal of the second combination is applied.

That is, the scan driver circuit 200 may simultaneously drive decoders, located in different stages, at the same time.

According to an embodiment of the present disclosure, the scan driver circuit 200 may be driven according to a driving method of the scan driver circuit.

For example, a method of driving a scan driver circuit for an active matrix array including a plurality of stages may include a step of driving sequentially a plurality of decoders at different driving timings based on a combination of a plurality of decoder signals in each of a plurality of stages, a step of driving a plurality of decoders at the same timing based on a combination of a plurality of decoder signals in different stages among the plural stages, and a step of sequentially outputting scan line signals according to driving states of the plural decoders by a last decoder among the plural decoders.

Accordingly, the present disclosure individually drives all scan lines by using a plurality of decoders, thereby being capable of providing a scan driver circuit capable of eliminating screen non-uniformity occurring upon implementation of ultra-high resolution and high refresh rates by a conventional shift register-type scan driver.

In addition, the present disclosure may drive more scan lines with a small number of signal lines, so that it is possible to provide a scan driver circuit for realizing an ultra-high-resolution active matrix array.

In addition, the present disclosure may provide a scan driver circuit suitable for the development of various form factors and the implementation of ultra-high resolution to further develop an active matrix array.

Figure 3:
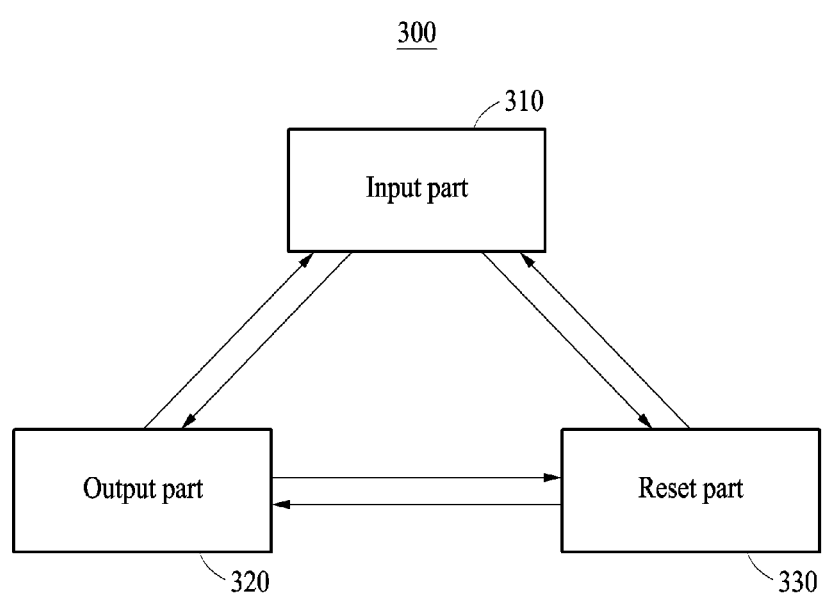
FIG. 3 illustrates a decoder according to an embodiment of the present disclosure.

FIG. 3 illustrates a decoder according to an embodiment of the present disclosure.

FIG. 3 illustrates components of the decoder according to an embodiment of the present disclosure.

Referring to FIG. 3, a decoder 300 according to an embodiment of the present disclosure includes an input part 310, an output part 320 and a reset part 330.

The decoder 300 according to an embodiment of the present disclosure may be the plural decoders illustrated in FIG. 2. The plural decoders of FIG. 2 include a first decoder and a second decoder.

For example, the input part 310 may include a first decoding transistor and fourth decoding transistor connected to a clock signal; and second, third, fifth and sixth decoding transistors that are connected in series to each of the first decoding transistor and the fourth decoding transistor and that are connected to the plural decoder signals.

Here, a decoder signal of the same bit is applied to the second decoding transistor and the fifth decoding transistor, and a decoder signal of the same bit is applied to the third decoding transistor and the sixth decoding transistor.

For example, the first to third decoding transistors may be included in the first decoder, and the fourth to sixth decoding transistors may be included in the second decoder.

The input part 310 according to an embodiment of the present disclosure may store a clock signal, as an input signal, in a first data node via first to sixth decoding transistors.

For example, the output part 320 may include first and sixth transistors connected to the first data node; and first and second capacitors connected between the first data node and the output terminal.

For example, the first decoder may include the first data node, the first transistor and the first capacitor, and the second decoder may include the first data node, the sixth transistor and the second capacitor.

For example, the output terminal of the first decoder may be connected to an input terminal of the second decoder.

According to an embodiment of the present disclosure, the output part 320 may output a clock signal to the output terminal through the first and sixth transistors.

Here, a signal outputted to the output terminal may be a scan line signal.

According to an embodiment of the present disclosure, the reset part 330 may include third and eighth transistors connected to the clock signal, fourth and ninth transistors connected to the first data node, and second, fifth, seventh and tenth transistors connected to a second data node configured to store a value opposite to a value of the first data node.

For example, the reset part 330 may reset the second data node according to an input state of the first data node and may connect the first data node and the output terminal to a low-level power line through the second data node.

Accordingly, the reset part 330 may prevent malfunction by maintaining stably a low-level voltage even when a clock signal and the output terminal are not connected (output operation).

For example, when the reset part 330 is not present, a problem that a signal is output to the output terminal due to a capacitor coupling phenomenon may occur, even if voltage is not charged in the first data node, when a clock signal becomes high.

Low-level power line VSS may be connected to the second data node through the fourth and ninth transistors, may be connected to the first data node through the fifth and tenth transistors, and may be connected to the output terminal through the second and seventh transistors.

A clock signal may be connected to the output terminal through the first and sixth transistors. When the clock signal is in a low state, VSS may be output and when the clock signal is in a high state, VDD may be output.

The circuit structure of the decoder 300 according to an embodiment of the present disclosure will be additionally described with reference to FIG. 4A.

Figure 4A:
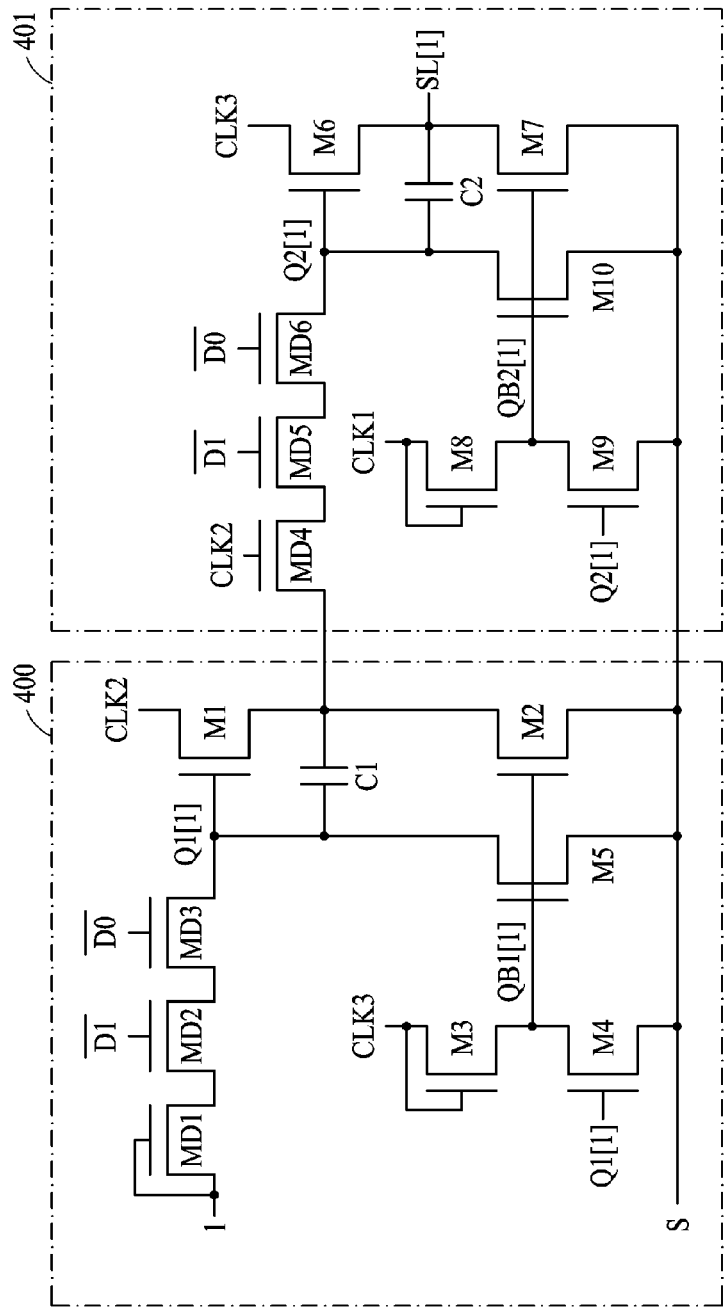
FIGS. 4A and 4B illustrate one stage of a scan driver circuit according to an embodiment of the present disclosure and an operation process thereof.
Figure 4B:
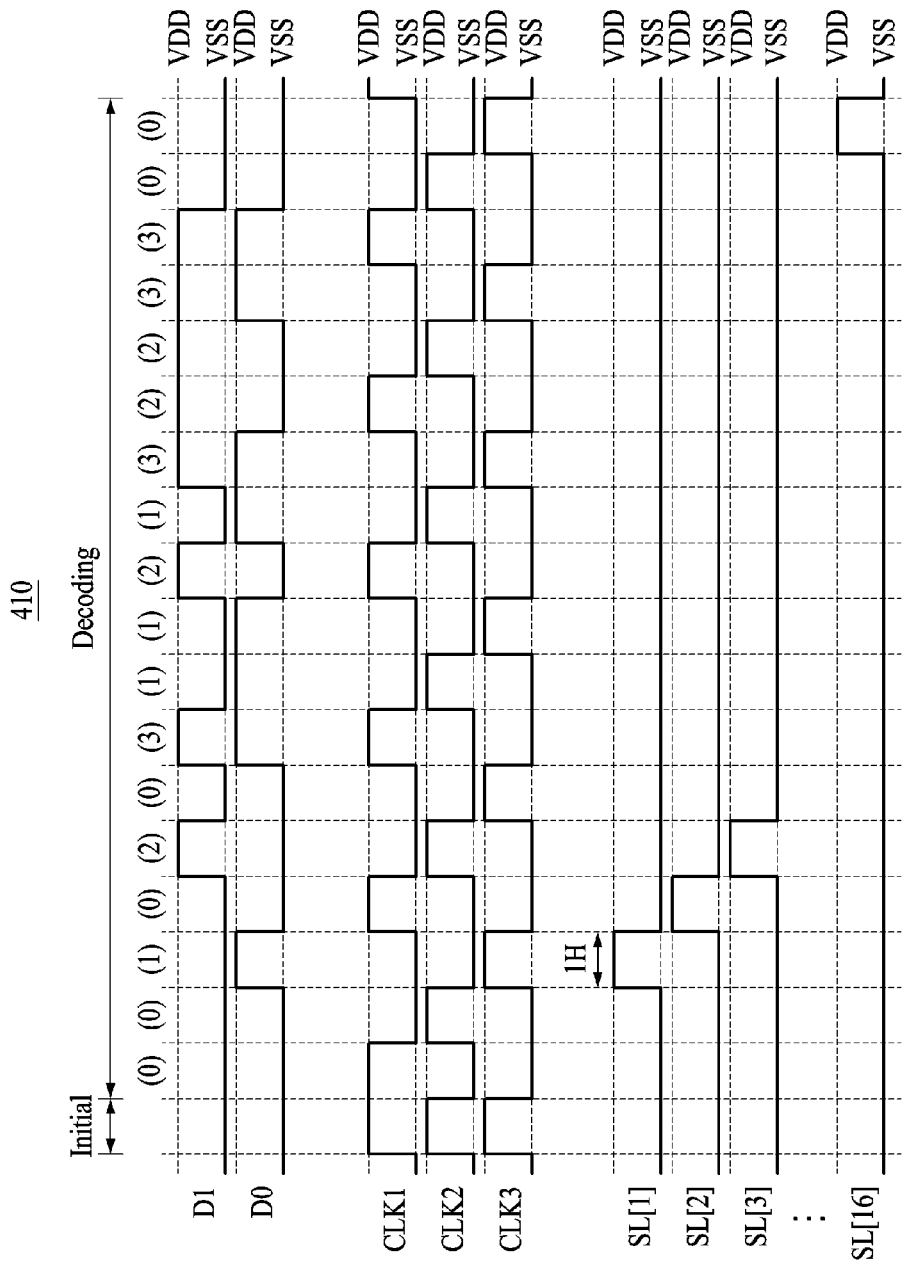

FIGS. 4A and 4B illustrate one stage of a scan driver circuit according to an embodiment of the present disclosure and an operation process thereof.

FIG. 4A illustrates a circuit structure including a plurality of decoders that constitute one stage of a scan driver circuit according to an embodiment of the present disclosure.

Referring to FIG. 4A, the one stage includes a first decoder 400 and a second decoder 401. A stage composed of two decoders is described in the figure, but an additional decoder may be included according to an embodiment.

The first decoder 400 may be divided into an input part, an output part and an reset part.

The input part of the first decoder 400 includes a first decoding transistor MD1, a second decoding transistor MD2 and a third decoding transistor MD3.

The first decoding transistor MD1, the second decoding transistor MD2 and the third decoding transistor MD3 are connected in series, a gate terminal of the first decoding transistor MD1 is connected to a clock signal CLK1, the second decoding transistor MD2 is connected to the first decoder signal, and the third decoding transistor MD3 is connected to the second decoder signal.

The output part of the first decoder 400 includes a first transistor M1 and a first capacitor C1, and a first data node Q1 is located at a portion connected to the third decoding transistor MD3.

The reset part of the first decoder 400 includes a second transistor M2, a third transistor M3, a fourth transistor M4 and a fifth transistor M5, and a second data node QB1 is included between the third transistor M3, the fourth transistor M4 and the fifth transistor M5.

A second decoder 410 may also be divided into an input part, an output part and an reset part.

The input part of the second decoder 410 includes a fourth decoding transistor MD4, a fifth decoding transistor MD5 and a sixth decoding transistor MD6.

The fourth decoding transistor MD4, the fifth decoding transistor MD5 and the sixth decoding transistor MD6 are connected in series, a gate terminal of the fourth decoding transistor MD4 is connected to an output terminal of the first decoder 400, the fifth decoding transistor MD5 is connected to a first decoder signal, and the sixth decoding transistor MD6 is connected to a second decoder signal.

That is, the first decoder 400 and the second decoder 410 use a decoder signal of the same bit.

The output part of the second decoder 410 includes a sixth transistor M6 and a second capacitor C2, and a first data node Q1 is located at a portion connected to the sixth decoding transistor MD6.

The reset part of the second decoder 410 includes a seventh transistor M7, an eighth transistor M8, a ninth transistor M9 and a tenth transistor M10, and a second data node QB1 is included between the eight transistor M8, the ninth transistor M9 and a tenth transistor M10.

A second data node QB2 is charged through a clock signal ahead of an input part, and the first data node Q1 and output terminals of the first decoder 400 and the second decoder 410 may be charged to VSS through transistors connected to the second data node QB1.

The reset part determines whether the second data node QB1 is reset to VSS according to whether the input unit charges the first data node Q1.

When the first data node Q1 is charged, the second data node QB1 is reset to a low-level voltage. In addition, since the second data node QB1 does not perform a reset operation, the first data node Q1 and the output terminal may be charged.

FIG. 4B illustrates a driving timing diagram of a plurality of decoders constituting one stage of a scan driver circuit according to an embodiment of the present disclosure.

Referring to a timing diagram 410 of FIG. 4B, high-level power of all driving waveforms may be VDD, and low-level power thereof may be VSS.

A first section of the timing diagram 410 is an initial period, and is a step in which an initial value of each node is set prior to driving.

For example, when there is no initial period, an unintended output may occur.

Driving applies all clock signals to VDD to charge voltages in second data nodes QB of all decoders and, at the same time, applies all decoder signals to VSS so that a first data node Q is not charged.

A decoding section is after an initial period and includes a section in which voltages are sequentially output as scan line signals from scan lines SL[1] to SL[16] as a specific circuit is selected and driven according to a combination of decoder signals.

In the timing diagram 410, the numbers (0) to (3) represent the number of cases according to a combination of decoder signals. Since the embodiment is 2 bits, decoder signal combinations corresponding to the number of 4 cases can be obtained.

For example, (0) may correspond to a first combination, (1) may correspond to a second combination, (2) may correspond to a third combination, and (3) may correspond to a fourth combination.

For example, (0) means that both D1 and D0 are low-level voltages, and, in the case, a decoder circuit connected to $\overline{D1}$ and $\overline{D0}$ can pass an input signal, and the other decoder circuits do not pass an input signal.

In the timing diagram 410, a first decoder of the first stage is selected and driven when (0) is applied.

Next, when (0) is applied, a second decoder of the first stage and a first decoder of the second stage are selected and driven.

Next, when (1) is applied, a waveform is output from a scan line SL[1] of the first stage, and a second decoder of the second stage and a first decoder of the third stage are selected and driven.

In a scan line driving circuit according to an embodiment of the present disclosure, the first stage is driven again after driving up to the 16th stage.

When driving timings of the plural decoders are overlapped, waveforms may be sequentially output from all scan lines without a blank period.

There is no overlapping section in the order of the decoder signal combinations, and after the last stage is driven, the first stage may be repeatedly driven.

FIGS. 5A to 5E illustrate a plurality of stages of a scan driver circuit according to an embodiment of the present disclosure and an operation process thereof.

FIGS. 5A to 5E sequentially illustrate operation states of a plurality of decoders in first and second stages.

Figure 5A:
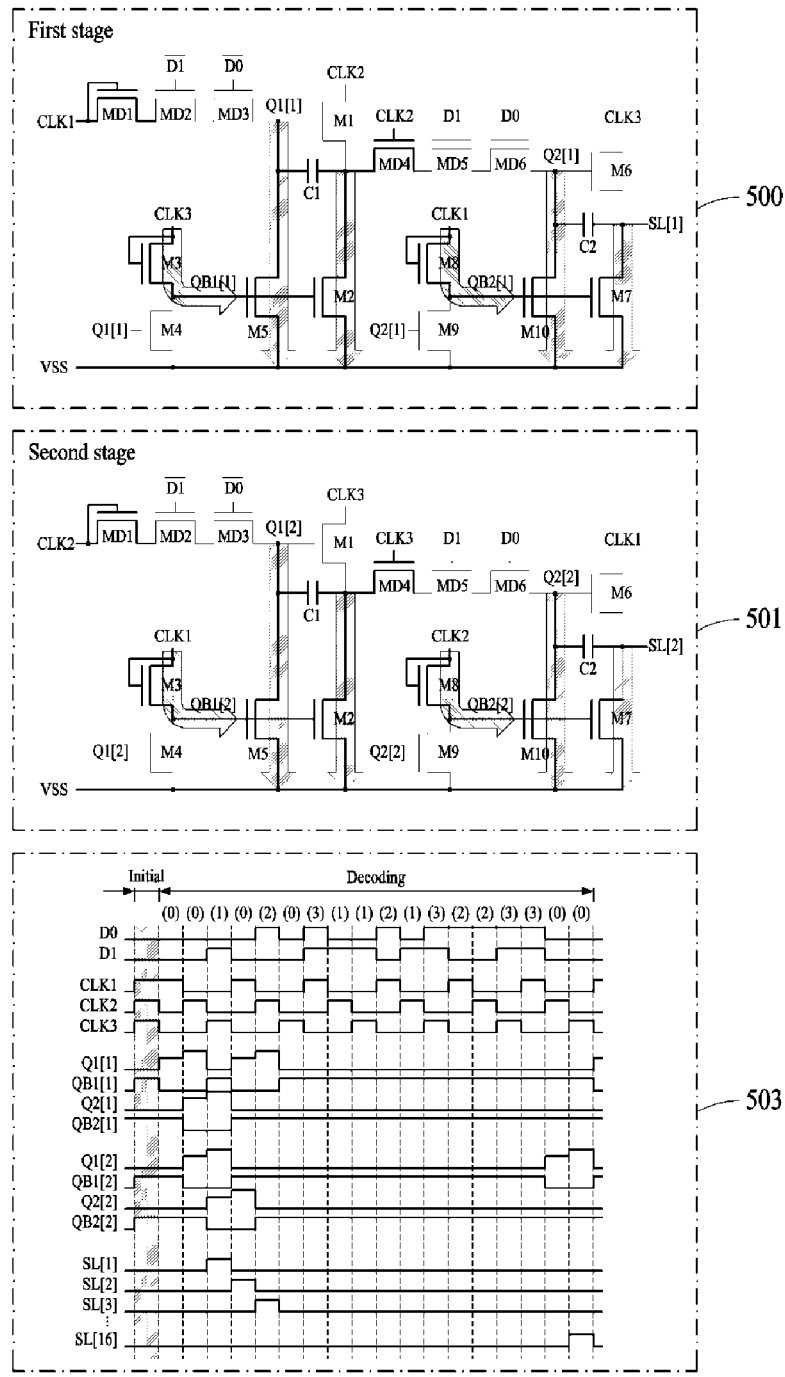
FIGS. 5A to 5E illustrate a plurality of stages of a scan driver circuit according to an embodiment of the present disclosure and an operation process thereof.

FIG. 5A illustrates a timing diagram 503 related to operations of a first stage 500 and a second stage 501. This may correspond to an initial operation period of the scan driver circuit.

According to an embodiment of the present disclosure, the first stage 500 and the second stage 501 operate in the same manner.

For example, the first stage 500 and the second stage 501 set initial values of first data nodes Q1 and Q2 and second data node QB1 and QB2.

Figure 5B:
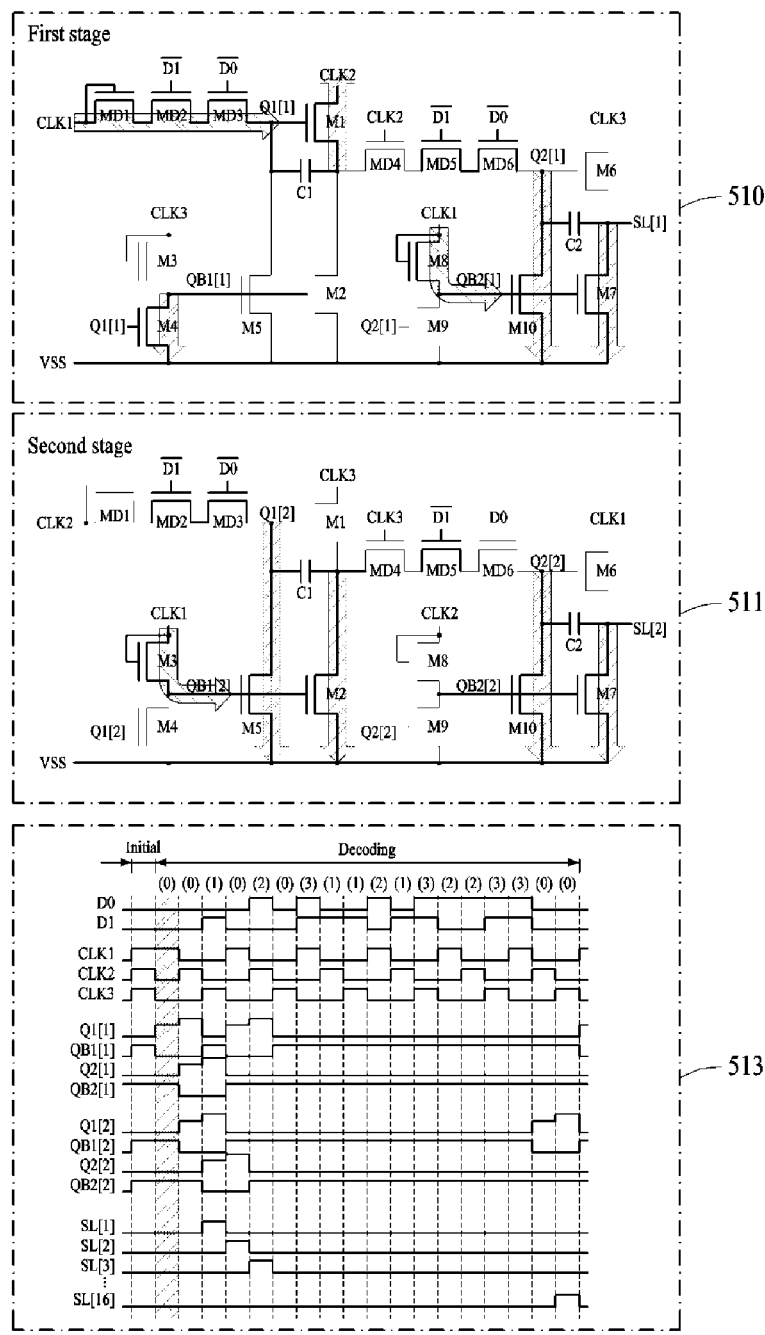

FIG. 5B illustrates a timing diagram 513 related to operations of a first stage 510 and a second stage 511. FIG. 5B may correspond to a case wherein a decoder signal of a first combination is applied to the scan driver circuit.

According to an embodiment of the present disclosure, the first decoder of the first stage 510 receives voltage and performs an operation of applying voltage to a first data node Q1[1], and a second decoder of the first stage 510 and first and second decoders of the second stage 511 maintain the same operation state as in an initial period.

Figure 5C:
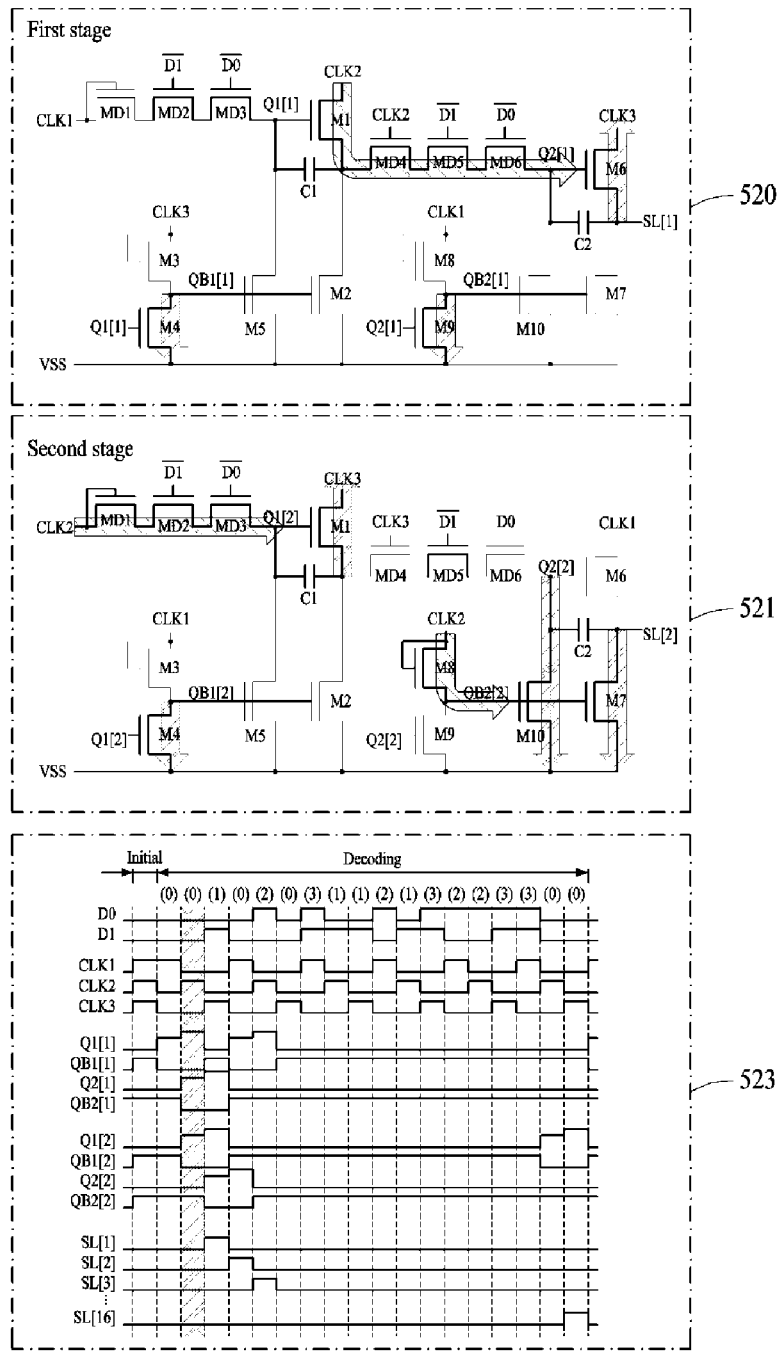

FIG. 5C illustrates a timing diagram 523 related to operations of a first stage 520 and a second stage 521 and may correspond to a case wherein a decoder signal of a first combination is applied to a scan driver circuit once more.

According to an embodiment of the present disclosure, a second decoder of the first stage 520 receives voltage and performs an operation of applying voltage to a first data node Q2[1], and a first decoder of the second stage 521 also receives voltage and performs an operation of applying voltage to a first data node Q1[2].

That is, the second decoder of the first stage 520 and the first decoder of the second stage 521 operate at the same timing.

Figure 5D:
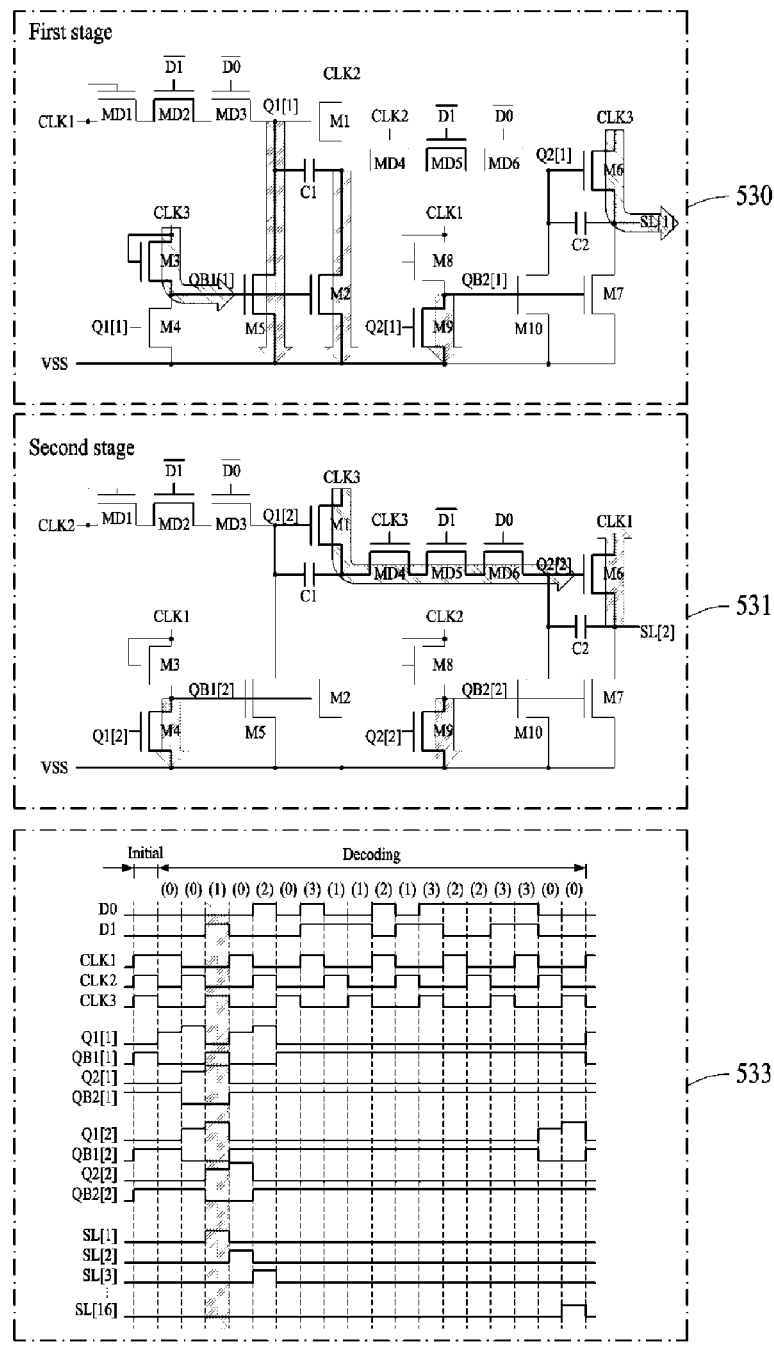

FIG. 5D illustrates a timing diagram 533 related to operations of a first stage 530 and a second stage 531 and may correspond to a case wherein a decoder signal of a second combination is applied to the scan driver circuit.

According to an embodiment of the present disclosure, a second decoder of the first stage 530 performs an operation of outputting a first scan line signal SL[1] through an output terminal, and a second decoder of the second stage 531 performs an operation of receiving voltage and applying voltage to a first data node Q2[2].

Here, when an additional stage is present, a first decoder of the additional stage may selectively operate.

Figure 5E:
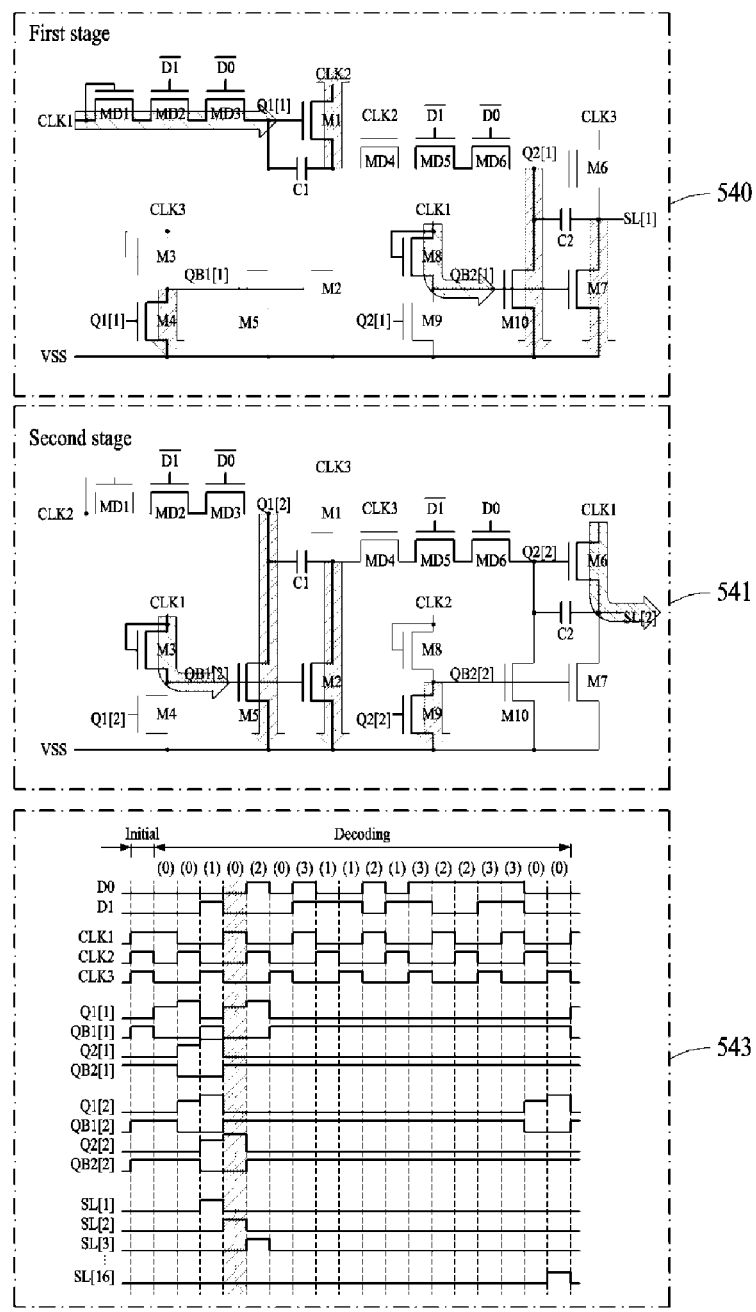

FIG. 5E illustrates a timing diagram 543 related to operations of a first stage 540 and a second stage 541 and may correspond to the case wherein the decoder signal of the first combination is applied to the scan driver circuit again.

According to an embodiment of the present disclosure, a second decoder of the second stage 541 performs an operation of outputting a second scan line signal SL[2] through an output terminal, and a first decoder of the first stage 540 performs an operation of receiving voltage and applying voltage to a first data node Q1[1].

That is, the scan driver circuit selectively performs the operation of the first decoder in the first stage 540 corresponding to an initial stage when outputting a scan line signal from the second stage 541 corresponding to a last stage.

Referring to FIGS. 5A to 5E, the scan driver circuit according to an embodiment of the present disclosure may sequentially output waveforms from all scan lines without blank timing when driving timings of the plural decoders are overlapped.

In addition, there is no overlapping section in the order of the decoder signal combinations for driving the scan driver circuit, and after the last stage is driven, the first stage may be repeatedly driven.

Figure 6:
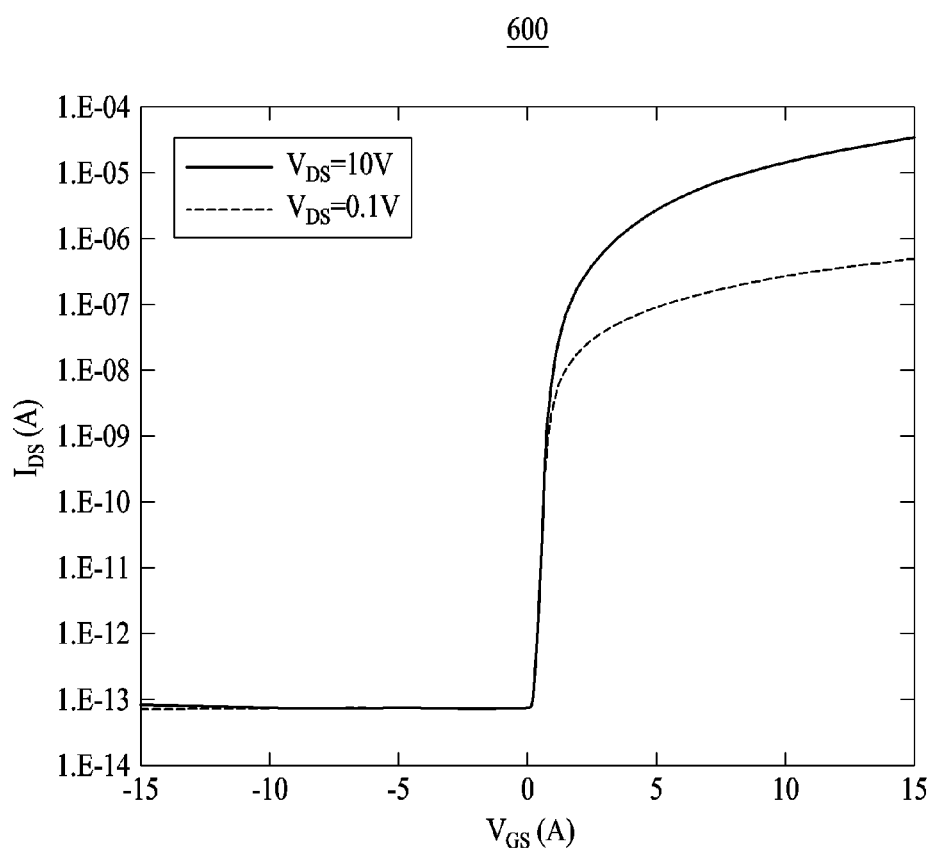
FIG. 6 illustrates the performance of a transistor in a scan driver circuit according to an embodiment of the present disclosure.

FIG. 6 illustrates the performance of a transistor in a scan driver circuit according to an embodiment of the present disclosure.

Referring to FIG. 6, a graph 600 illustrates a simulation result of a transition characteristic of the transistor in the scan driver circuit.

Referring to the graph 600, a transition characteristic of the transistor in the scan driver circuit is excellent in a positive voltage region.

FIGS. 7A to 7D illustrate a simulation result of a scan driver circuit according to an embodiment of the present disclosure.

Figure 7A:
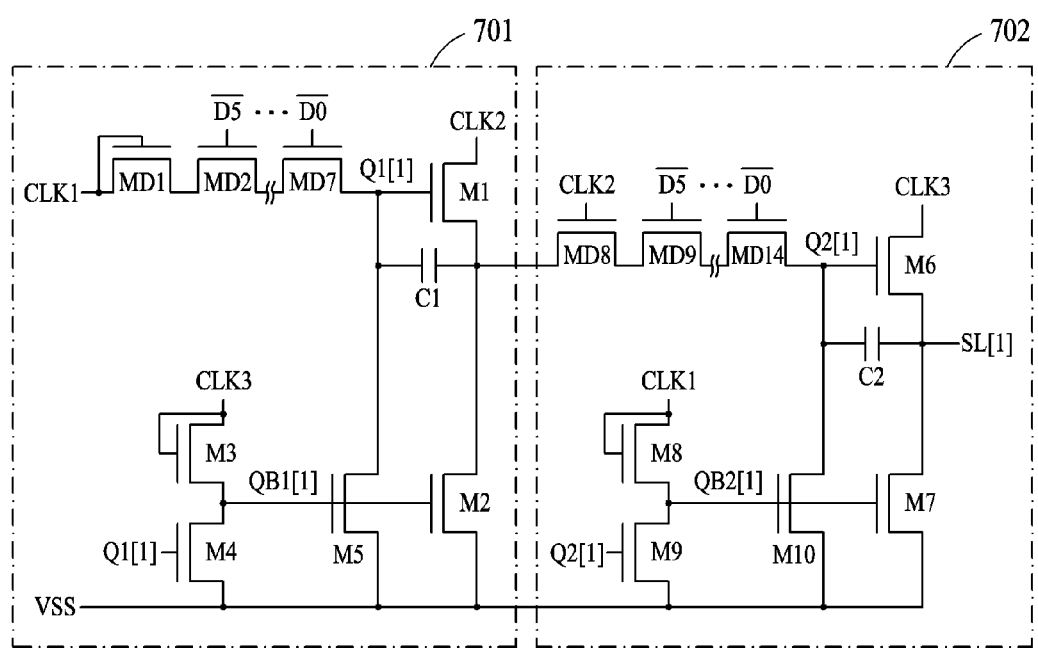
FIGS. 7A to 7D illustrate a simulation result of a scan driver circuit according to an embodiment of the present disclosure.
Figure 7B:
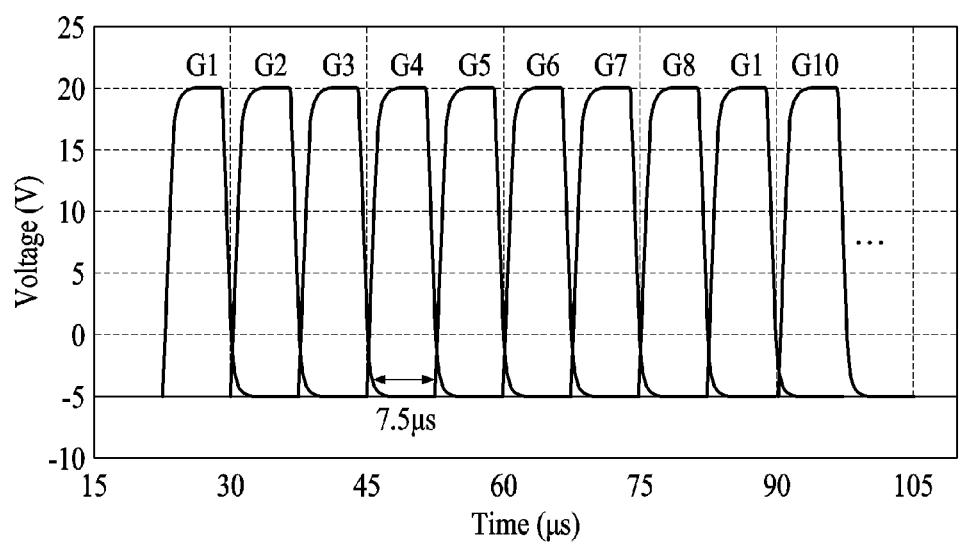
Figure 7C:
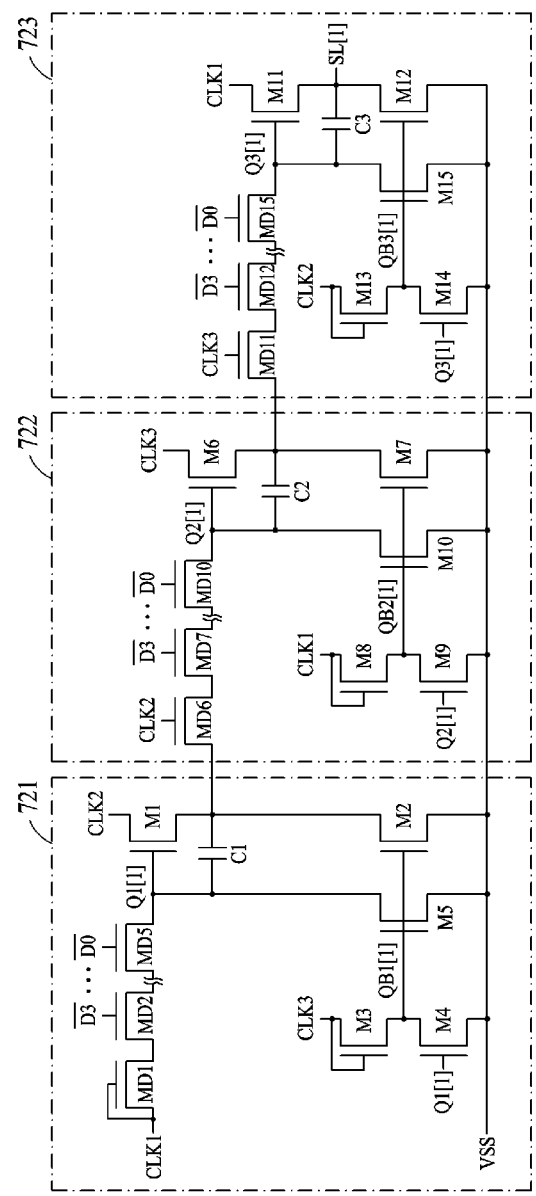
Figure 7D:
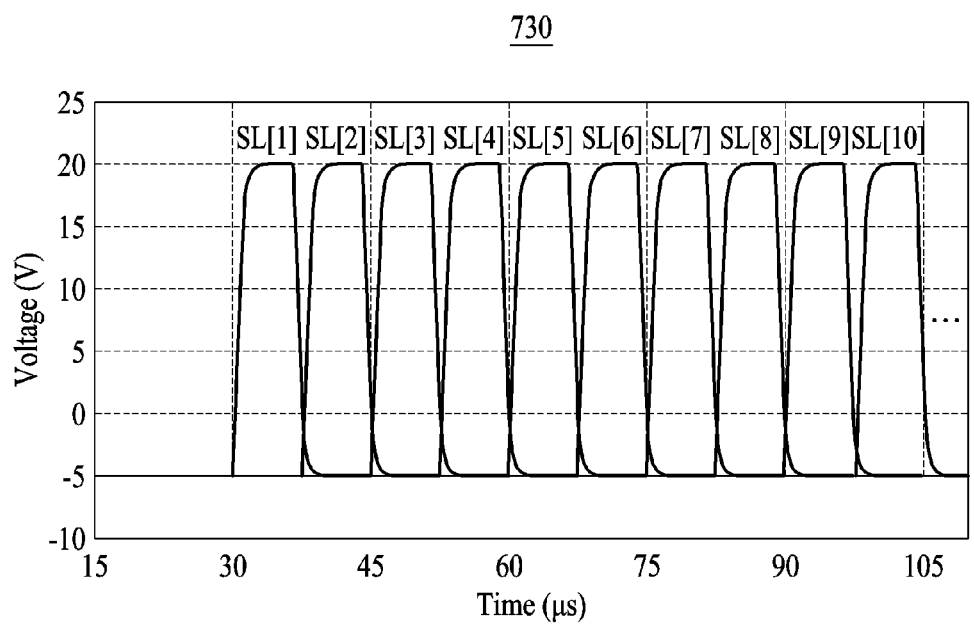

FIGS. 7A and 7B illustrate a simulation result of a scan driver circuit using two decoders in each stage according to an embodiment of the present disclosure, and FIGS. 7C and 7D illustrate a simulation result of a scan driver circuit using three decoders in each stage according to an embodiment of the present disclosure.

Referring to FIGS. 7A and 7B, a stage 700 uses a first decoder 701 and a second decoder 702, and a graph 710 illustrates a voltage change dependent upon time change.

In the graph 710, voltage output may correspond to a scan line signal outputted in each stage, and a time interval may be about 7.5 μs.

The stage 700 may be composed of 24 transistors and may use 16 signals, and gate output may be 4096.

Referring to FIGS. 7C and 7D, a stage 720 uses a first decoder 721, a second decoder 722 and a third decoder 723, and a graph 730 illustrates a voltage change dependent upon time change.

In the graph 730, voltage output may correspond to a scan line signal outputted in each stage, and a time interval may be about 7.5 μs.

The stage 720 may be composed of 30 transistors and may use 12 signals, and gate output may be 4096.

That is, as the number of decoders used in the stage increases, the number of signals required to represent the same gate output may be reduced.

Simulation results of a conventional technology and the stages 700 and 720 are summarized in Table 1 below.

TABLE 1

|  | Conventional technology | Present disclosure | | |
| --- | --- | --- | --- | --- |
|  |  | Number of decoders | 2 decoders | 3 decoders |
|  |  | Number of bits | 6 | 4 |
| Maximum output number | 4096 | Maximum output number | 4096 | 4096 |

TABLE 1-continued

|  | Conventional technology |  | Present disclosure | |
| --- | --- | --- | --- | --- |
|  |  | Number of decoders<br>Number of bits | 2 decoders<br>6 | 3 decoders<br>4 |
| Number of signals | 25 | Number of signals | 16 | 12 |
| Number of transistors | 22 | Number of transistors | 24 | 30 |

Referring to Table 1, the conventional technology can be utilized in devices, such as a flexible active matrix array, to which mechanical stress is continuously applied because the number of signals required for driving 4K UHD is relatively large compared to the present disclosure, and is not suitable for a circuit, such as an implantable circuit for healthcare, whose fault-tolerance must be ensured. In addition, as the number of signals increases, the complexity of circuit may increase.

On the other hand, the scan driver circuit according to an embodiment of the present disclosure has a relatively small signal number, thereby being suitable for a flexible active matrix array.

The number of lines driven by a scan driver for 4K UHD is 2160, and the number of signals capable of driving 4096 lines is used to drive 2160 lines.

For example, the number of signals may correspond to the number of signal lines for outputting scan line signals.

Accordingly, the present disclosure can provide a scan driver circuit that is suitable for a flexible circuit by individually driving scan lines and that is capable of realizing high resolution by using a small number of signal lines.

In addition, the present disclosure can provide a scan driver circuit suitable for a flexible active matrix array, to which a lot of stress is applied, by individually controlling and driving all scan lines so that an error does not affect subsequent circuits.

In addition, the present disclosure can drive only a specific block related to a specific screen to reduce unnecessary power consumption, thereby being capable of providing a scan driver circuit applicable to a device, which maintains a specific screen for a long time, such as a low-power wearable device.

Figure 8:
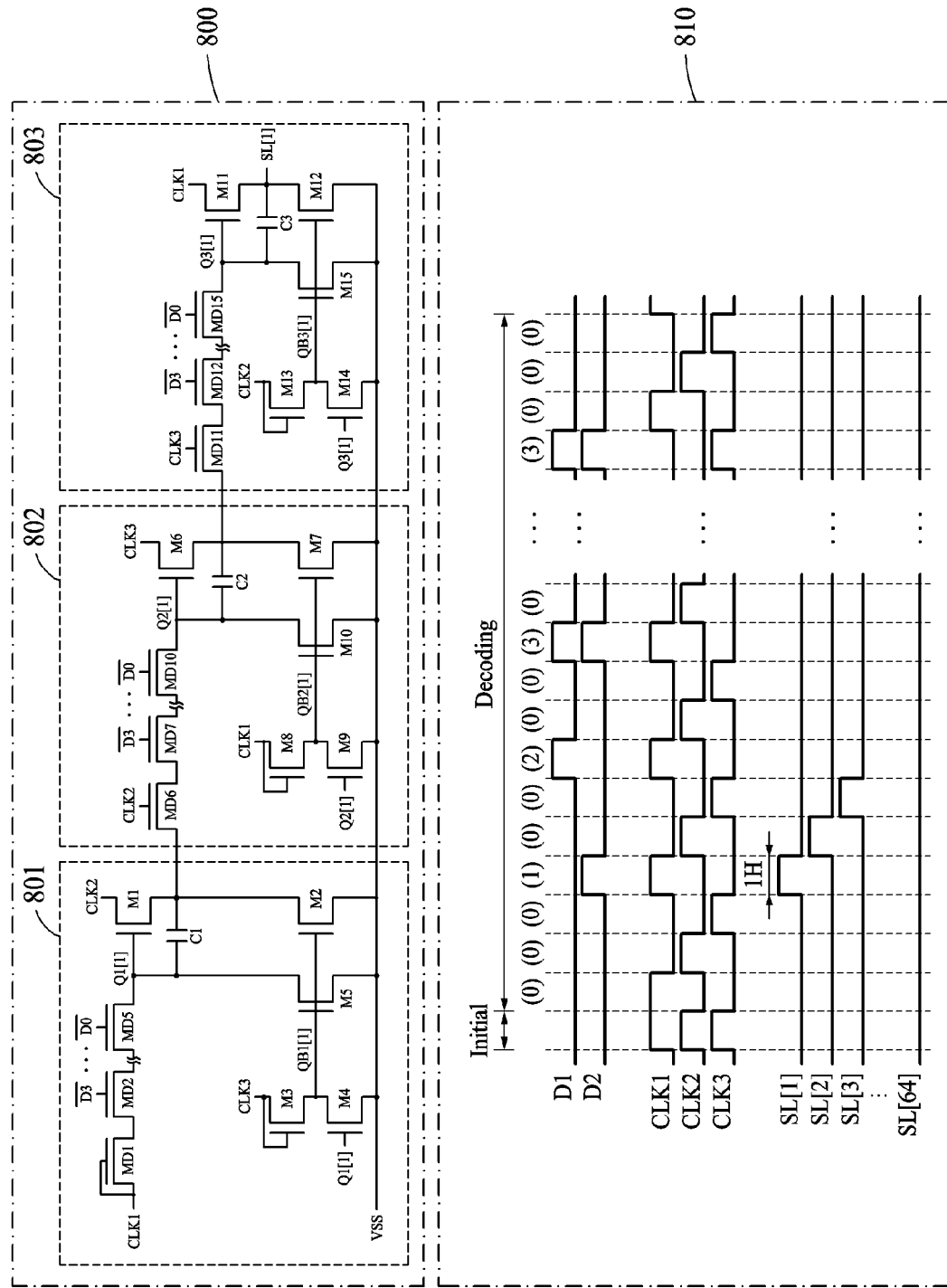
FIG. 8 illustrates the structure and input and output signals of a three decoders-composed stage of a scan driver circuit according to an embodiment of the present disclosure.

FIG. 8 illustrates the structure and input and output signals of a three decoders-composed stage of a scan driver circuit according to an embodiment of the present disclosure.

Referring to FIG. 8, a stage 800 of a scan driver according to an embodiment of the present disclosure uses a first decoder 801, a second decoder 802 and a third decoder 803, additionally includes a stage having the same structure as the stage 800, and outputs first scan line signal SL[1] to 64th scan line signal SL[64] according to a signal of a timing diagram 810.

In the first, second, and third decoders 801, 802 and 803 of the stage 800 of the scan driver according to an embodiment of the present disclosure, the same decoder signals $\overline{D1}$ and $\overline{D0}$ are used.

In the first decoder 801, decoder signal line $\overline{D1}$ is connected to a transistor MD2, and a decoder signal line $\overline{D0}$ is connected to a transistor MD3.

In addition, in the second decoder 802, a decoder signal line $\overline{D1}$ is connected to a transistor MD5, and a decoder signal line $\overline{D0}$ is connected to a transistor MD6.

Further, in the third decoder 803, a decoder signal line $\overline{D1}$ is connected to a transistor MD8, and a decoder signal line $\overline{D0}$ is connected to a transistor MD9.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The methods according to the embodiments of the present disclosure may be implemented in the form of a program command that can be executed through various computer means and recorded in a computer-readable medium. The computer-readable medium can store program commands, data files, data structures or combinations thereof. The program commands recorded in the medium may be specially designed and configured for the present disclosure or be known to those skilled in the field of computer software. Examples of a computer-readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include machine language code created by a compiler and high-level language code executable by a computer using an interpreter and the like. The hardware devices described above may be configured to operate as one or more software modules to perform the operations of the embodiments, and vice versa.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A scan driver circuit for an active matrix array, wherein the scan driver circuit comprises a plurality of stages,
   wherein a plurality of decoder signals are used in each of the plural stages, and the scan driver circuit comprises a plurality of decoders that are sequentially driven at different driving timings in the same stage based on a combination of the plural decoder signals or that are driven at the same timing in different stages,
   wherein a last decoder of the plural decoders sequentially outputs a scan line signal according to a driving state of the plural decoders in each of the plural stages,
   wherein each of the plural decoders comprises an input part, an output part and a reset part,
   wherein the input part comprises a first decoding transistor and fourth decoding transistor connected to a clock signal; and second, third, fifth and sixth decoding transistors that are connected in series to each of the first decoding transistor and the fourth decoding transistor and that are connected to the plural decoder signals.

2. The scan driver circuit according to claim 1, wherein the combination of plural decoder signals comprises at least one of a first combination wherein first and second decoder signals among the plural decoder signals indicate a low state, a second combination wherein the first decoder signal indicates a low state and the second decoder signal indicates a high state, a third combination wherein the first decoder signal indicates a high state and the second decoder signal indicates a low state, and a fourth combination wherein the first and second decoder signals indicate a high state.

3. The scan driver circuit according to claim 1, wherein a first decoder among the plural decoders comprised in the second stage among the plural stages is driven at the same timing as a second decoder among the plural decoders comprised in a first stage among the plural stages, based on a combination of the plural decoder signals.

4. The scan driver circuit according to claim 2, wherein a first decoder of a first stage among the plural stages is selectively driven when a decoder signal of the first combination is initially applied.

5. The scan driver circuit according to claim 1, wherein the input part stores a clock signal, as an input signal, in a first data node via first to sixth decoding transistors.

6. The scan driver circuit according to claim 5, wherein the output part comprises first and sixth transistors connected to the first data node; and first and second capacitors connected between the first data node and the output terminal.

7. The scan driver circuit according to claim 6, wherein the output part outputs the clock signal to the output terminal through the first and sixth transistors.

8. The scan driver circuit according to claim 5, wherein the reset part comprises third and eighth transistors connected to the clock signal, fourth and ninth transistors connected to the first data node, and second, fifth, seventh and tenth transistors connected to a second data node configured to store a value opposite to a value of the first data node.

9. The scan driver circuit according to claim 8, wherein the reset part resets the second data node according to an input state of the first data node and connects the first data node and the output terminal to a low-level power line through the second data node.

10. A scan driver circuit for an active matrix array, wherein the scan driver circuit comprises a plurality of stages,
    wherein a plurality of decoder signals are used in each of the plural stages, and the scan driver circuit comprises a plurality of decoders that are sequentially driven at different driving timings in the same stage based on a combination of the plural decoder signals or that are driven at the same timing in different stages,
    wherein a last decoder of the plural decoders sequentially outputs a scan line signal according to a driving state of the plural decoders in each of the plural stages,
    wherein the combination of plural decoder signals comprises at least one of a first combination,
    wherein first and second decoder signals among the plural decoder signals indicate a low state, a second combination wherein the first decoder signal indicates a low state and the second decoder signal indicates a high state, a third combination,
    wherein the first decoder signal indicates a high state and the second decoder signal indicates a low state, and a fourth combination wherein the first aid second decoder signals indicate a high state,
    wherein a first decoder of a first stage among the plural stages is selectively driven when a decoder signal of the first combination is initially applied, and
    wherein the second decoder of the first stage among the plural stages and the first decoder of the second stage among the plural stages are selectively driven when the decoder signal of the first combination is applied secondarily.

11. The scan driver circuit according to claim 10, wherein the first stage among the plural stages outputs a scan line signal when a decoder signal of the second combination is applied.

12. The scan driver circuit according to claim 10, wherein a second decoder of the second stage among the plural stages and a first decoder of a third stage among the plural stages are selectively driven when the decoder signal of the second combination is applied.

13. A method of driving a scan driver circuit for an active matrix array, wherein the scan driver circuit comprises a plurality of stages,
    the method comprising:
    driving sequentially a plurality of decoders at different driving timings based on a combination of a plurality of decoder signals in each of the plural stages;
    driving a plurality of decoders at the same timing based on a combination of the plural decoder signals in different stages among the plural stages; and
    outputting sequentially scan line signals according to a driving state of the plural decoders in a last decoder among the plural decoders,
    wherein each of the plural decoders comprises an input part, an output part and a reset part, and
    wherein the input pan comprises a first decoding transistor and a fourth decoding transistor connected to a clock signal; and second, third, fifth and sixth decoding transistors that are connected in series to each of the first decoding transistor and the fourth decoding transistor and that are connected to the plural decoder signals.

14. The method according to claim 13, wherein the combination of plural decoder signals comprises at least one of a first combination wherein first and second decoder signals among the plural decoder signals indicate a low state, a second combination wherein the first decoder signal indicates a low state and the second decoder signal indicates a high state, a third combination wherein the first decoder signal indicates a high state and the second decoder signal indicates a low state, and a fourth combination wherein the first and second decoder signals indicate a high state.

15. The method according to claim 13, wherein the driving of the plural decoders at the same timing comprises driving the first decoder among the plural decoders included in the second stage among the plural stages at the same timing as the second decoder among the plural decoders included in the first stage among the plural stages, based on a combination of the plural decoder signals.

\* \* \* \* \*